US012149236B2

(12) United States Patent
Guduri et al.

(10) Patent No.: US 12,149,236 B2
(45) Date of Patent: Nov. 19, 2024

(54) PRE-BIASED DUAL CURRENT SENSING

(71) Applicant: TEXAS INSTRUMENTS INCORPORATED, Dallas, TX (US)

(72) Inventors: Venkatesh Guduri, Bangalore (IN); Ashish Ojha, Bangalore (IN); Priyank Anand, Bangalore (IN); Richeek Maitra, Chinsurah (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/827,406

(22) Filed: May 27, 2022

(65) Prior Publication Data

US 2023/0387908 A1 Nov. 30, 2023

(51) Int. Cl.
*H03K 17/00* (2006.01)
*H03K 17/30* (2006.01)
*H03K 17/687* (2006.01)

(52) U.S. Cl.
CPC .......... *H03K 17/30* (2013.01); *H03K 17/687* (2013.01); *H03K 2217/0063* (2013.01); *H03K 2217/0072* (2013.01)

(58) Field of Classification Search
CPC .... H03K 17/30; H03K 17/687; H03K 17/302; H03K 17/161; H03K 17/12; H03K 17/107; H03K 17/102; H03K 17/10; H03K 2217/0072; H03K 2217/0063; H03K 17/20
See application file for complete search history.

(56) References Cited

U.S. PATENT DOCUMENTS

2019/0238100 A1* 8/2019 Kimura .................. G01R 31/40

FOREIGN PATENT DOCUMENTS

EP 3715873 * 9/2020

* cited by examiner

*Primary Examiner* — Tuan T Lam

(74) *Attorney, Agent, or Firm* — Valerie M. Davis; Frank D. Cimino

(57) ABSTRACT

In an example, a system includes a first transistor and a second transistor, the first transistor and the second transistor configured to provide current to a load. The system also includes a sense transistor coupled to the first transistor, the sense transistor configured to sense a current flowing through the first transistor. The system includes an amplifier coupled to the sense transistor, where the amplifier includes a first input, a second input, and an output. The system also includes pre-bias circuitry coupled to the amplifier, where the pre-bias circuitry is configured to provide a voltage to the first input of the amplifier responsive to the first transistor being off, where the voltage biases the amplifier.

26 Claims, 5 Drawing Sheets

PRE-BIASED DUAL CURRENT SENSING

BACKGROUND

A driver circuit uses a high-side transistor and a low-side transistor to drive current to a load, such as a motor. The driver may be used for a contactor or a peak/hold solenoid in some examples. Another example use for the driver circuit may be a battery junction box. The transistors in the driver circuit alternate between on and off states to provide the current to the load. If the high-side transistor and low-side transistor are turned on simultaneously, a current path may be created from the voltage supply to ground. To prevent this current path (known as shoot-through), dead time may be inserted between turning off one transistor and turning on the other transistor, so that both transistor are not conducting at the same time.

SUMMARY

In accordance with at least one example of the description, a system includes a first transistor and a second transistor, the first transistor and the second transistor configured to provide current to a load. The system also includes a sense transistor coupled to the first transistor, the sense transistor configured to sense a current flowing through the first transistor. The system includes an amplifier coupled to the sense transistor, where the amplifier includes a first input, a second input, and an output. The system also includes pre-bias circuitry coupled to the amplifier, where the pre-bias circuitry is configured to provide a voltage to the first input of the amplifier responsive to the first transistor being off, where the voltage biases the amplifier.

In accordance with at least one example of the description, a circuit in a system having a first transistor and a second transistor operable to provide current to a load includes a first sense transistor coupled to the first transistor, the first sense transistor configured to sense a first current flowing through the first transistor. The circuit also includes a second sense transistor coupled to the second transistor, the second sense transistor configured to sense a second current flowing through the second transistor. The circuit includes a first amplifier coupled to the first sense transistor and a second amplifier coupled to the second sense transistor. The circuit also includes first pre-bias circuitry coupled to the first amplifier, where the first pre-bias circuitry is configured to provide a first voltage to an input of the first amplifier responsive to the first transistor being off, where the first voltage biases the first amplifier. The circuit also includes second pre-bias circuitry coupled to the second amplifier, where the second pre-bias circuitry is configured to provide a second voltage to an input of the second amplifier responsive to the second transistor being off, where the second voltage biases the second amplifier.

In accordance with at least one example of the description, a method includes providing current to a load with a first transistor and a second transistor. The method also includes sensing a current flowing through the first transistor with a sense transistor. The method includes, responsive to the first transistor being on, providing a voltage to an input of a sense amplifier via the sense transistor. The method also includes, responsive to the first transistor being off, providing a voltage to the input of the sense amplifier with a third transistor.

In accordance with at least one example of the description, a circuit in a system having a high-side transistor and a low-side transistor incorporated into a driver includes a first sense transistor coupled to the high-side transistor. The circuit also includes a second sense transistor coupled to the low-side transistor. The circuit includes a first amplifier coupled to the first sense transistor. The circuit also includes a second amplifier coupled to the second sense transistor. The circuit includes first pre-bias circuitry coupled to the first amplifier, where the first pre-bias circuitry includes a first voltage source, a first current source, and a first pre-bias transistor coupled to the first sense transistor. The circuit also includes second pre-bias circuitry coupled to the second amplifier, where the second pre-bias circuitry includes a second voltage source, a second current source, a second pre-bias transistor coupled to a first input of the second amplifier, and a third pre-bias transistor coupled to a second input of the second amplifier.

BRIEF DESCRIPTION OF THE DRAWINGS

The same reference numbers or other reference designators are used in the drawings to designate the same or similar (functionally and/or structurally) features.

DETAILED DESCRIPTION

Figure 1B:
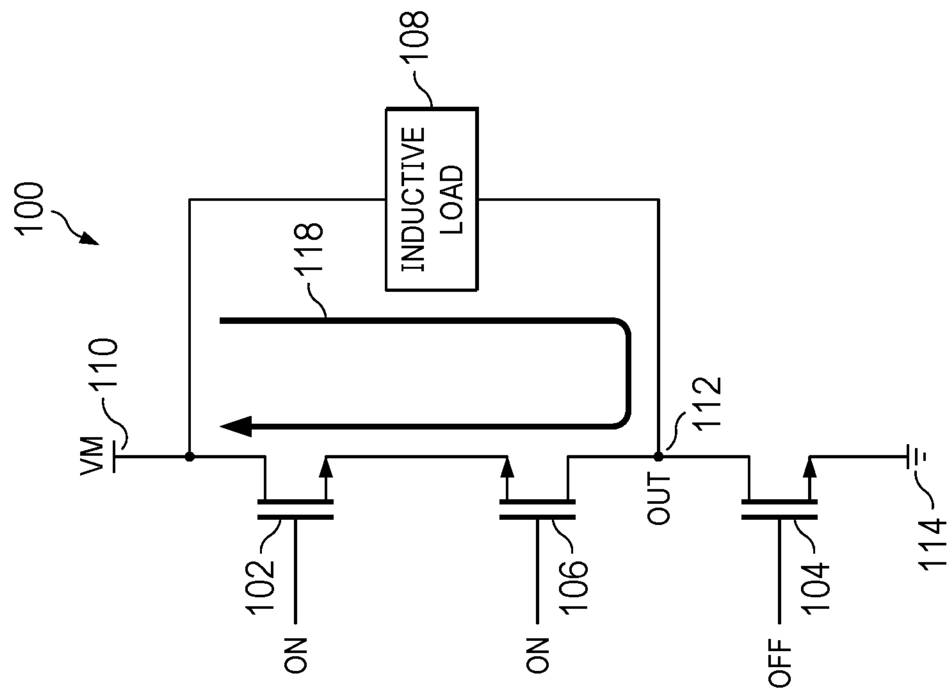
FIG. 1B is a circuit diagram of a conventional driver.

In a driver, a current sense scheme may be used that senses the current provided to the load. The sensed current is provided to a controller within or coupled to a semiconductor device (also referred to as a "chip") that regulates the driver. The chip may use the sensed current to switch the operating state of the driver or perform other actions, including critical safety actions or actions that improve efficiency. Sensing both the high-side current from the high-side transistor and the low-side current from the low-side transistor is referred to as dual current sensing. Current sensing may be performed for each transistor with circuitry that includes a sense amplifier. However, if dead time is inserted to prevent shoot-through, the high-side transistor and the low-side transistor are off for longer periods of time, allowing the internal node voltages and voltages across capacitors to drop within the sense amplifiers, potentially to zero volts. If a transistor is off, the reference voltage for the sense amplifier that senses current for that transistor is also zero. As the transistor turns back on, the internal node voltages and voltages across capacitors within the sense amplifier for that transistor have to increase from zero (or near zero) to their steady-state operating values for the sense amplifier to operate properly. The time it takes for these voltages within the sense amplifier to increase is referred to as the settling time. At lower load currents, the settling time of the sense amplifier may be high (because it takes longer for the internal voltages to increase), and the bandwidth of the sense amplifier may be low. The settling time may increase due to the insertion of dead time to prevent shoot-through. The delay between the transistor turning on and the settling of the sense amplifier affects the minimum duty cycle of the driver. The current sense circuitry that provides useful current information to the chip (such as the sense amplifier) may therefore also reduce the switching speed of the driver.

In examples herein, dual current sensing is performed, where the high-side transistor and the low-side transistor are each coupled to a separate sense amplifier. As an example, if the high-side transistor is off, a reference voltage for the sense amplifier coupled to the high-side transistor is generated by a passive transistor and additional circuitry. Therefore, the sense amplifier is pre-biased and placed in an active condition even if the high-side transistor is off. After the high-side transistor turns on, the reference voltage for the sense amplifier switches from the passive transistor to the high-side transistor. Because the sense amplifier is pre-charged prior to the high-side transistor turning back on, the settling time of the sense amplifier is much lower than in other solutions. The delay between the high-side transistor turning on and the current sense amplifier reaching its operating state is reduced, which allows the driver to achieve a higher switching speed. A similar solution may be implemented for the low-side transistor, where the sense amplifier coupled to the low-side transistor is pre-biased with a passive transistor and additional circuitry. In the examples described herein, the driver may achieve a higher frequency of operation while still receiving current sense information from the sense amplifiers. In the examples herein, dead time may be implemented to prevent shoot through while still having a lower settling time and a higher switching speed.

Figure 1A:
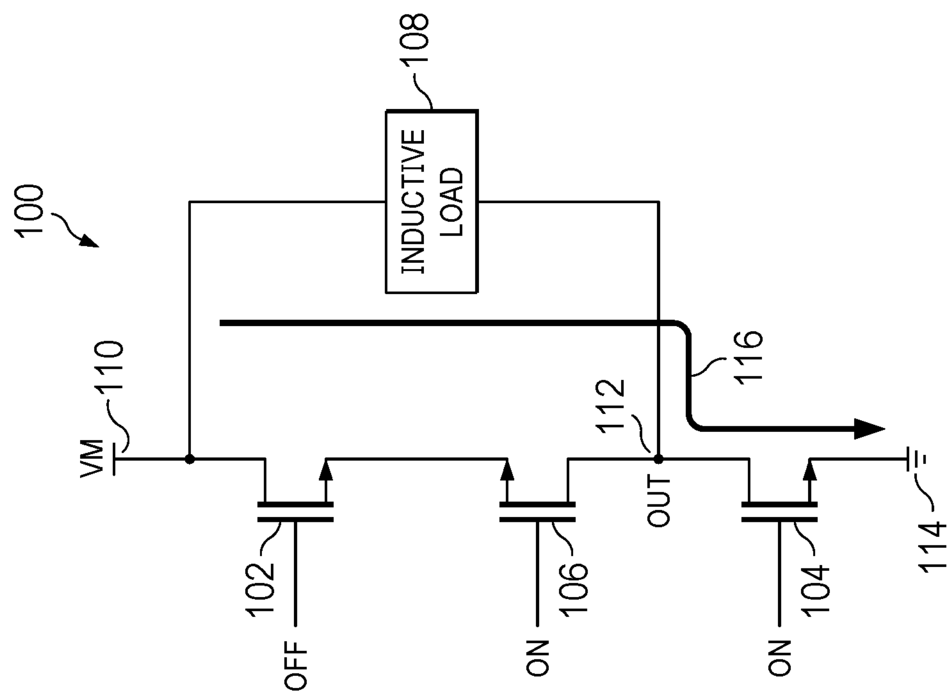
FIG. 1A is a circuit diagram of a conventional driver.

FIGS. 1A and 1B are simplified circuit diagrams of a conventional driver 100. In some cases, driver 100 may be a contactor driver. In FIGS. 1A and 1B, the same reference numbers or other reference designators are used to designate the same or similar (functionally and/or structurally) features. FIG. 1A shows driver 100 during a charge phase, and FIG. 1B shows driver 100 during a recirculation phase. Driver 100 includes a high-side transistor 102, a low-side transistor 104, and a quench transistor 106. High-side transistor 102, low-side transistor 104, and quench transistor 106 may be referred to as power transistors herein. The inductive load 108 is coupled between a voltage source VM 110 and OUT node 112. Voltage source VM 110 provides a supply voltage to driver 100. Transistors 102, 104, and 106 may be metal-oxide-semiconductor field effect transistors ("MOSFET") (such as an n-channel MOSFET (NFET or NMOS), or a p-channel MOSFET, (PFET or PMOS)) in some cases. In this case, high-side transistor 102 is an NMOS transistor. High-side transistor 102 has a drain coupled to voltage source VM 110 and a source coupled to a source of quench transistor 106. The drain of high-side transistor 102 is also coupled to inductive load 108. The gate of high-side transistor 102 is coupled to a controller or other circuitry (not shown in FIG. 1A), which is configured to provide a control signal to the gate of high-side transistor 102 that turns on or turns off high-side transistor 102 to control the operation of driver 100.

Low-side transistor 104 is an NMOS transistor in this case. Low-side transistor 104 has a drain coupled to OUT node 112 and to inductive load 108. The source of low-side transistor 104 is coupled to ground 114 in this case. The gate of low-side transistor 104 is coupled to a controller or other circuitry (not shown in FIG. 1A), which is configured to provide a control signal to the gate of low-side transistor 104 that turns on or turns off low-side transistor 104 to control the operation of driver 100.

Quench transistor 106 is an NMOS transistor in this case. Quench transistor 106 has a source coupled to a source of high-side transistor 102. Quench transistor 106 has a drain coupled to OUT node 112 and to the drain of low-side transistor 104. The gate of quench transistor 106 is coupled to a controller or other circuitry (not shown in FIG. 1A), which is configured to provide a control signal to the gate of quench transistor 106 that turns on or turns off quench transistor 106 to control the operation of driver 100.

FIG. 1A shows driver 100 during a charge phase. During the charge phase, current 116 flows through inductive load 108 and low-side transistor 104 as shown. During the charge phase, low-side transistor 104 is on. Low-side transistor 104 is turned on by a "high" signal (e.g., a signal having a voltage magnitude that is greater than the threshold voltage of transistor 104) from the controller or other circuitry coupled to the gate of low-side transistor 104. The state of low-side transistor 104 during the charge phase is denoted by the signal "ON" at the gate of low-side transistor 104.

During the charge phase, quench transistor 106 is also on, denoted by the signal "ON" at the gate of quench transistor 106. During the charge phase, high-side transistor 102 is off (e.g., by applying a "low" signal to the gate of high-side transistor 102—where the "low signal" is a signal having a voltage magnitude that is less than the threshold voltage for transistor 102), denoted by the signal "OFF" at the gate of high-side transistor 102. During the charge phase, current 116 flows from voltage source VM 110, through inductive load 108, through OUT node 112, through low-side transistor 104 and to ground 114.

FIG. 1B shows driver 100 during a recirculation phase. During the recirculation phase, current 118 flows through inductive load 108, OUT node 112, quench transistor 106, high-side transistor 102, and to voltage source VM 110 as shown. During the recirculation phase, high-side transistor 102 is on. High-side transistor 102 is turned on by a high signal from the controller or other circuitry coupled to the gate of high-side transistor 102. The state of high-side transistor 102 during the recirculation phase is denoted by the signal "ON" at the gate of high-side transistor 102.

During the recirculation phase, quench transistor 106 is also on, denoted by the signal "ON" at the gate of quench transistor 106. During the recirculation phase, low-side transistor 104 is off, denoted by the signal "OFF" at the gate of low-side transistor 104.

During the charge phase of driver 100 (shown in FIG. 1A), current 116 flows through the inductive load 108 as shown, and the current builds in the inductive load 108. To disconnect the inductive load 108, high-side transistor 102 is turned on. Turning on high-side transistor 102 and turning off low-side transistor 104 places driver 100 in the recirculation phase, shown in FIG. 1B. During the recirculation phase, the current 118 begins decaying. When the current 118 drops to a predetermined level, low-side transistor 104 is turned on (and high-side transistor 102 is turned off) and current 116 through inductive load 108 begins to rise. Switching high-side transistor 102 and low-side transistor 104 on and off creates a sawtooth pattern, which regulates the current through inductive load 108. The switching of high-side transistor 102 and low-side transistor 104 may be controlled by a controller or other circuitry that receives feedback regarding the current flowing through inductive load 108 during each phase. This feedback may be provided by sense amplifiers, as described below.

Figure 2:
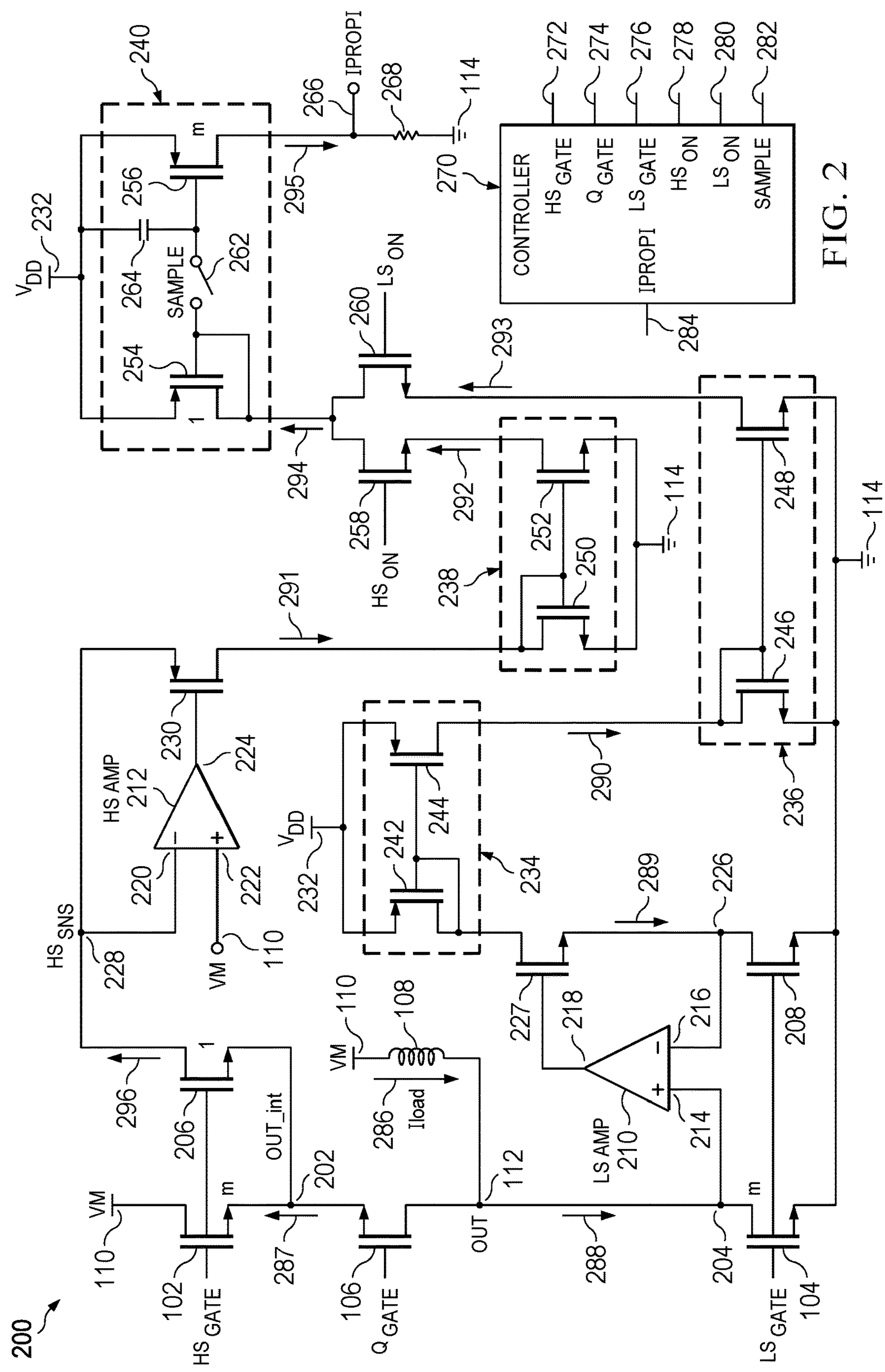
FIG. 2 is a circuit diagram of a driver with current sensing in accordance with various examples herein.

FIG. 2 is a circuit diagram of a driver 200 with current sensing for both the high-side transistor 102 and low-side transistor 104 in accordance with various examples. In FIG. 2, the same reference numbers or other reference designators are used to designate the same or similar (functionally and/or structurally) features.

Driver 200 includes high-side transistor 102, low-side transistor 104, quench transistor 106, inductive load 108, voltage source VM 110, OUT node 112, and ground 114. These components operate as described above with respect to FIGS. 1A and 1B. Driver 200 also includes OUT_int node 202 and node 204. Driver 200 includes high-side sense transistor 206 and low-side sense transistor 208. Driver 200 includes low-side sense amplifier 210 (LS AMP) and high-side sense amplifier 212 (HS AMP). Low-side sense amplifier 210 has a first input 214, a second input 216, and an output 218. First input 214 is coupled to node 204, second input 216 is coupled to node 226, and output 218 is coupled to transistor 227. High-side sense amplifier 212 has a first input 220, a second input 222, and an output 224. First input 220 is coupled to node 228, second input 222 is coupled to voltage source VM 110, and output 224 is coupled to transistor 230.

Driver 200 also includes voltage source $V_{DD}$ 232. Driver 200 includes current mirrors 234, 236, 238, and 240. Current mirror 234 includes transistors 242 and 244. Current mirror 236 includes transistors 246 and 248. Current mirror 238 includes transistors 250 and 252. Current mirror 240 includes transistors 254 and 256. The transistors in the current mirrors described herein may have any suitable size ratio. Driver 200 also includes transistors 258 and 260. Driver 200 includes sample switch 262, capacitor 264, IPROPI pin 266 (e.g., sense current (I) proportional to load current (I)), and resistor 268.

Driver 200 also includes controller 270. Controller 270 includes pins 272, 274, 276, 278, 280, 282, and 284. These pins couple to various components in driver 200 to send or receive signals between controller 270 and the various components, as described below. The connections to the components are not directly shown in FIG. 2 for simplicity.

Driver 200 also includes a number of currents, such as currents 286, 287, 288, 289, 290, 291, 292, 293, 294, and 295. These currents are described below with the description of the operation of driver 200.

In operation, sense amplifiers 210 and 212 sense the current through their respective transistor, and that sensed current is mirrored and provided to controller 270 via the IPROPI pin 266. Controller 270 may then control the operation of driver 200 (via various signals from pins 272, 274, 276, 278, 280, 282, and 284) using the sensed current as feedback to regulate the load current 286.

Various transistors in driver 200 may be NMOS or PMOS transistors as shown in FIG. 2. Other transistors (or equivalent devices) may be used instead with little or no change to the remaining circuitry.

During a charge phase (as shown in FIG. 1A), high-side transistor 102 is off, and low-side transistor 104 and quench transistor 106 are on. High-side transistor 102 is turned off by a signal from controller 270 at pin 272 ($HS_{GATE}$) provided to the gate of high-side transistor 102. Low-side transistor 104 is turned on by a signal from controller 270 at pin 276 ($LS_{GATE}$) provided to the gate of low-side transistor 104. Quench transistor 106 is turned on by a signal from controller 270 at pin 274 ($Q_{GATE}$) provided to the gate of quench transistor 106. During the charge phase, load current 286 flows through node 112, then to low-side transistor 104 (shown as current 288), and then to ground 114. As current 288 flows through low-side transistor 104, low-side sense transistor 208 mirrors current 288 and produces current 289. Low-side sense transistor 208 has a gate coupled to the gate of low-side transistor 104. The source of low-side sense transistor 208 is coupled to ground 114. The drain of low-side sense transistor 208 is coupled to node 226. The ratio of the size of the currents 288 and 289 is approximately the same as the ratio of the size of low-side transistor 104 compared to low-side sense transistor 208. Low-side transistor 104 may have a size of m, whereas low-side sense transistor 208 may have a size of 1. In this case, m is larger than 1. Therefore, the ratio of the size of the transistors (m:1) is also the ratio of the size of current 288 to current 289. Low-side sense transistor 208 scales the current 288 flowing through low-side transistor 104, so that current 288 may be mirrored and ultimately measured at IPROPI pin 266.

While current 288 is flowing through low-side transistor 104, low-side sense amplifier 210 equalizes the voltages at the drain of low-side transistor 104 (node 204) and low-side sense transistor 208 (node 226). The current 289 is mirrored by current mirror 234. In this example, current mirror 234 includes PMOS transistors 242 and 244, with their gates coupled together, and their sources coupled to voltage source $V_{DD}$ 232. Voltage source $V_{DD}$ 232 may provide a different voltage than voltage source VM 110. For instance, voltage source $V_{DD}$ 232 may provide a lower voltage, such as 5 V. A drain of transistor 242 is coupled to its gate and to the drain of transistor 227. A drain of transistor 244 is coupled to the drain of transistor 246.

Current mirror 234 mirrors current 289 to produce current 290. Current 290 is then mirrored by current mirror 236. Current mirror 236 includes transistors 246 and 248, which are NMOS transistors in this example. The gates of transistors 246 and 248 are coupled together, and the sources of transistors 246 and 248 are coupled to ground. The drain of transistor 246 is coupled to its gate and to the drain of transistor 244 in current mirror 234. The drain of transistor 248 is coupled to the source of transistor 260. Current mirror 236 mirrors current 290 and provides current 293 to transistor 260.

Transistor 260 is an NMOS transistor. Transistor 260 has a source coupled to a drain of transistor 248 and a drain coupled to a drain of transistor 258. The gate of transistor 260 is coupled to an $LS_{ON}$ pin 280 of controller 270. Controller 270 provides a signal on $LS_{ON}$ pin 280 when low-side transistor 104 is on, and this $LS_{ON}$ signal provided to the gate of transistor 260 turns on transistor 260. If transistor 260 is turned on, current 293 is provided to current mirror 240, which is shown as current 294 in FIG. 2.

Current mirror 240 receives current 294 and mirrors it to produce current 295. Current mirror 240 includes transistors 254 and 256. Transistors 254 and 256 are PMOS transistors. A drain of transistor 254 is coupled to the drain of transistor 260 and the gate of transistor 254. The source of transistor 254 is coupled to voltage source $V_{DD}$ 232. Transistor 256 has a gate coupled to the gate of transistor 254 via sample switch 262. Transistor 256 has a source coupled to voltage source $V_{DD}$ 232 and a drain coupled to IPROPI pin 266 and resistor 268, which is coupled to ground 114. Sample switch 262 couples the gates of transistors 254 and 256 together. Current mirror 240 also includes a capacitor 264 coupled to voltage source $V_{DD}$ 232 and to the gate of transistor 256. Sample switch 262 is controlled by a signal from SAMPLE pin 282 from controller 270. When either the high-side transistor 102 or low-side transistor 104 is on, sample switch 262 is closed (e.g., conducting). During the dead time between turning off one transistor 102 or 104 and turning on the other transistor, sample switch 262 may be opened (e.g., non-conducting). Opening sample switch 262 during the dead time provides a current to IPROPI pin 266, which is sensed by controller 270 via pin 284.

During the charge phase, when low-side transistor 104 is on, current 295 is provided to IPROPI pin 266, where controller 270 reads the value of current 295. Current 295 is indicative of the load current 286, and controller 270 receives this current value and determines when to transition transistors 102, 104, 106, and other signals in FIG. 2. Therefore, controller 270 controls the operation of driver 200 by monitoring the value of load current 286 and appropriately switching the signals in FIG. 2.

The process described above relates to the charge phase of driver 200, where low-side transistor 104 is on and high-side transistor 102 is off. A similar process may be performed when high-side transistor 102 is on and low-side transistor 104 is off (e.g., the recirculation phase of FIG. 1B). During the recirculation phase, current through high-side transistor 102 is mirrored and ultimately provided to IPROPI pin 266, so controller 270 can monitor the load current during this phase. In some cases, during the recirculation phase, high-side transistor 102 is turned on by a signal from controller 270 at pin 272 ($HS_{GATE}$) provided to the gate of high-side transistor 102. Low-side transistor 104 is turned off by a signal from controller 270 at pin 276 ($LS_{GATE}$) provided to the gate of low-side transistor 104. Quench transistor 106 is turned on by a signal from controller 270 at pin 274 ($Q_{GATE}$) provided to the gate of quench transistor 106. During the recirculation phase, load current 286 flows through node 112, quench transistor 106, high-side transistor 102 (shown as current 287), and then to voltage source VM 110. As current 287 flows through high-side transistor 102, high-side sense transistor 206 mirrors current 287 and produces current 296. High-side sense transistor 206 has a gate coupled to the gate of high-side transistor 102. The source of high-side sense transistor 206 is coupled to OUT_int node 202 and to the source of high-side transistor 102. The drain of high-side sense transistor 206 is coupled to node 228, referred to as the high-side sense node 228 ($HS_{SNS}$ 228). The ratio of the size of the currents 287 and 296 is the ratio of the size of high-side transistor 102 compared to high-side sense transistor 206. High-side transistor 102 may have a size of m, whereas high-side sense transistor 206 may have a size of 1. In this case, m is larger than 1. Therefore, the ratio of the size of the transistors (m:1) is also the ratio of the size of current 287 to current 296. This ratio may be the same or different than the ratio between low-side transistor 104 and low-side sense transistor 208. On the high side, high-side sense transistor 206 scales the current 287 flowing through high-side transistor 102, so that current 287 may be mirrored and ultimately measured at IPROPI pin 266.

The drain of high-side sense transistor 206 is coupled to the first input 220 of high-side sense amplifier 212. The second input of high-side sense amplifier 212 is coupled to voltage source VM 110. An output of high-side sense amplifier 212 is coupled to a gate of transistor 230. Transistor 230 may be a PMOS transistor in this example. The source of transistor 230 is coupled to $HS_{SNS}$ 228. The drain of transistor 230 is coupled to a drain of transistor 250 in current mirror 238.

For high-side current sensing, high-side sense amplifier 212 equalizes the drain voltage of high-side sense transistor 206 (e.g., the voltage at $HS_{SNS}$ 228) with the drain voltage of high-side transistor 102 (which is the voltage at voltage source VM 110). High-side sense amplifier 212 achieves this by having second input 222 coupled to voltage source VM 110. The current through transistor 230 is current 291, and current 291 is provided to current mirror 238.

Current mirror 238 includes transistors 250 and 252. Transistors 250 and 252 may be NMOS transistors. The gate of transistor 250 is coupled to its drain and to the gate of transistor 252. The source of transistor 250 is coupled to ground 114. The source of transistor 252 is also coupled to ground 114. Current mirror 238 mirrors current 291 and provides current 292 to transistor 258.

Transistor 258 is an NMOS transistor in this case. Transistor 258 has a source coupled to a drain of transistor 252 and a drain coupled to a drain of transistor 260. The gate of transistor 258 is coupled to an $HS_{ON}$ pin 278 of controller 270. Controller 270 provides a signal on $HS_{ON}$ pin 278 when high-side transistor 102 is on, and this $HS_{ON}$ signal provided to the gate of transistor 258 turns on transistor 258. If transistor 258 is turned on, current 292 is provided to current mirror 240, which is shown as current 294 in FIG. 2.

If current 294 is the high-side current provided to current mirror 240 during the recirculation phase, current mirror 240 operates as described above with respect to the charge phase. Current mirror 240 receives the current 294, which is representative of the current through high-side transistor 102, and mirrors that current to provide it to IPROPI pin 266. Controller 270 reads the current from IPROPI pin 266 during the recirculation phase, and uses the current information to control driver 200.

In the example of FIG. 2, current sensing is performed with sense amplifiers 210 and 212. If high-side transistor 102 is off, the reference voltage at first input 220 may be a floating value and undefined. The internal node voltages and voltages across capacitors in high-side sense amplifier 212 may go to zero. As high-side transistor 102 turns back on, the internal node voltages and voltages across capacitors within high-side sense amplifier 212 have to increase to their steady-state operating values for high-side sense amplifier 212 to operate properly. At lower load currents, this settling time of high-side sense amplifier 212 may be high (because it takes longer for the internal voltages to increase), and the bandwidth of high-side sense amplifier 212 may be low. The delay between high-side transistor 102 turning on and the settling of high-side sense amplifier 212 affects the minimum duty cycle of driver 200. A similar situation occurs with low-side transistor 104 and low-side sense amplifier 210. When low-side transistor 104 is off, the voltage at node 204 is a floating value and is undefined, and the internal node voltages and voltages across capacitors in low-side sense amplifier 210 may go to zero. The time it takes to recharge these voltages after low-side transistor 104 turns back on affects the minimum duty cycle of driver 200.

In other examples described below with respect to FIGS. 3-7, a reference voltage for the sense amplifier coupled to the high-side transistor is generated by a passive transistor and additional circuitry if the high-side transistor is off. Therefore, the sense amplifier is pre-biased and placed in an active condition when the high-side transistor is off After the high-side transistor turns on, the reference voltage for the sense amplifier switches from the passive transistor to the high-side transistor. Because the sense amplifier is pre-charged or pre-biased prior to the high-side transistor turning back on, the settling time of the sense amplifier is much lower than in the example solution described above with respect to FIG. 2. A similar solution may be implemented for the low-side transistor in some examples, where the sense amplifier coupled to the low-side transistor is pre-biased with a passive transistor and additional circuitry. In the examples described below, a driver or other component may achieve a higher frequency of operation than the example of FIG. 2 while still receiving current sense information from the sense amplifiers.

Figure 3:
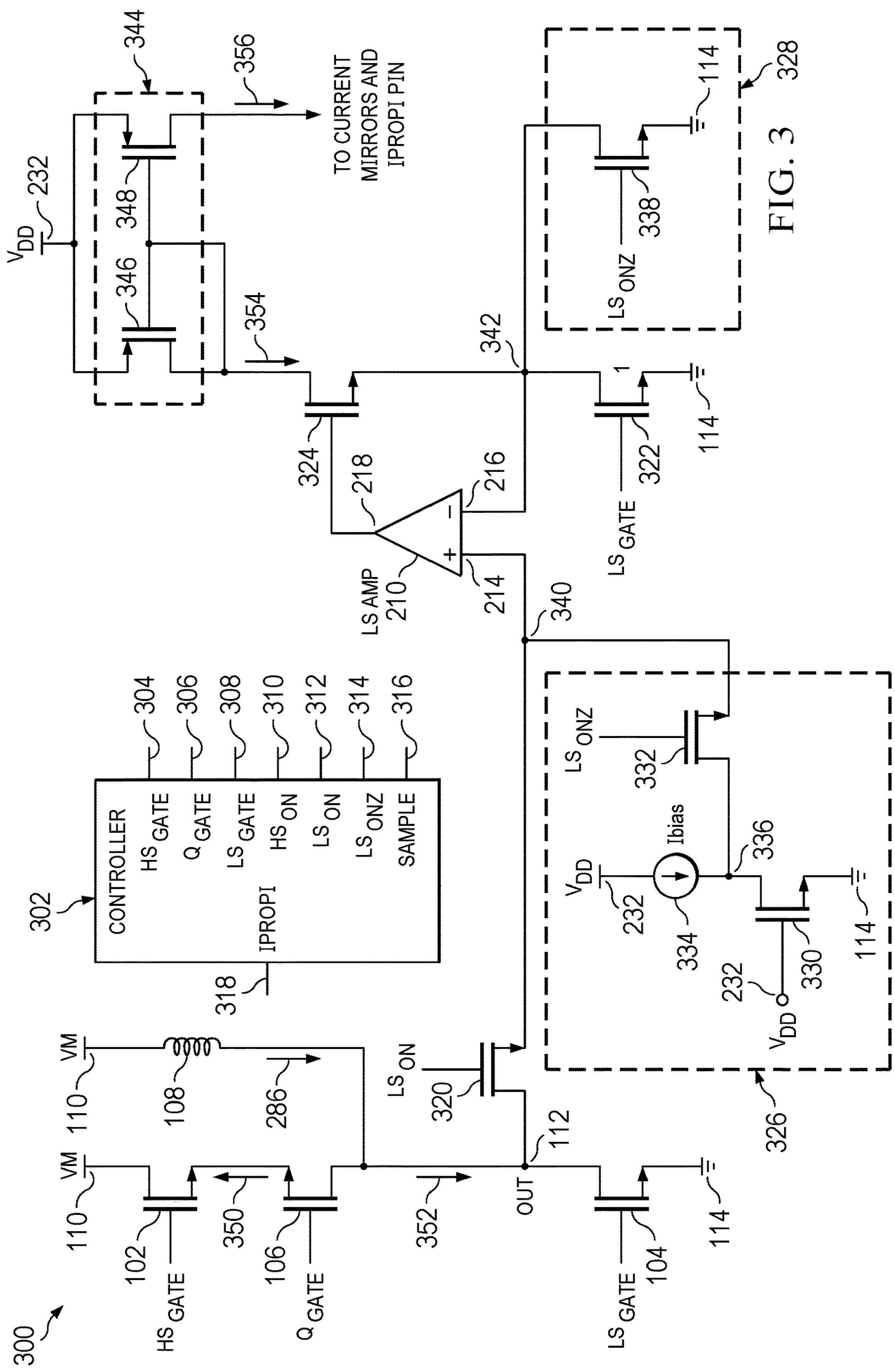
FIG. 3 is a circuit diagram for low-side current sensing in accordance with various examples herein.

FIG. 3 is a diagram of a circuit 300 for low-side current sensing in accordance with various examples herein. Circuit 300 includes passive circuitry to pre-bias the low-side sense amplifier if the low-side transistor is off. Pre-biasing the low-side sense amplifier (e.g., low side amplifier 210) reduces the delay between the low-side transistor (e.g., transistor 104) turning on and the settling time of the low-side sense amplifier. Circuitry to pre-bias the high-side sense amplifier is not shown in FIG. 3 for simplicity, but is instead shown in FIG. 4 and described below. Circuit 300 may be used with our without the circuit 400 and vice versa.

In FIG. 3, various transistors in circuit 300 may be NMOS or PMOS transistors as shown in FIG. 3. Other transistors (or equivalent devices) may be used instead with little or no change to the remaining circuitry. Circuit 300 includes high-side transistor 102, low-side transistor 104, and quench transistor 106. In some examples, quench transistor 106 may be removed, and low-side transistor 104 is directly coupled to high-side transistor 102. The examples herein may also include drivers that do not have quench transistor 106. Circuit 300 also includes load 108 (and/or a node/terminal/pin that may be connected to a load 108), voltage source VM 110 (and/or a node/terminal/pin that may be connected to a voltage source VM 110), node 112, ground 114 (and/or a node/terminal/pin that may be connected to a common potential, such as ground 114), and low-side sense amplifier 210. Low-side sense amplifier 210 has a first input 214, a second input 216, and an output 218. Circuit 300 also includes voltage source $V_{DD}$ 232 (and/or a node/terminal/pin that may be connected to a voltage source $V_{DD}$ 232).

Circuit 300 includes controller 302. In some example embodiments, circuit 300 is implemented in the same package and/or semiconductor die as controller 302, but in other example embodiments they are implemented in separate packages and/or semiconductor die. Controller 302 is configured to control the operation of the circuitry in circuit 300 (via various signals from pins 304, 306, 308, 310, 312, 314, 316, and 318) using a sensed current as feedback to regulate the load current 286. Controller 302 includes any hardware, software, firmware, digital logic, or circuitry for performing the operations described herein. Controller 302 may be a processor, microprocessor, microcontroller, power management integrated circuit, system-on-a-chip, or any other device suitable for performing the operations herein. Controller 302 may include other pins and connections not shown here.

Circuit 300 also includes transistors 320, 322, and 324. Circuit 300 includes pre-biasing circuitry 326 and 328. Pre-biasing circuitry 326 and 328 are configured to pre-bias low-side sense amplifier 210 if low-side transistor 104 is off. Pre-biasing circuitry 326 includes transistors 330, 332, current source 334, and node 336. Pre-biasing circuitry 328 includes transistor 338. Transistors 330, 332, and 338 may be referred to as pre-bias transistors in some examples.

Circuit 300 also includes nodes 340 and 342. Circuit 300 includes current mirror 344, which includes transistors 346 and 348. Circuit 300 also includes a number of currents, such as current 350, 352, 354, and 356.

In operation, the circuitry in circuit 300 measures a sense current (e.g., where the sense current is represented by current 356) for low-side transistor 104, which is provided to the IPROPI pin 318 so controller 302 may manage the operation of the circuit. The circuitry also pre-biases low-side sense amplifier 210 if low-side transistor 104 is off, to reduce the settling time of low-side sense amplifier 210 after low-side transistor 104 turns on.

If low-side transistor 104 is on (e.g., turned on by a signal provided from controller 302 at pin 308 ($LS_{GATE}$) to the gate of low-side transistor 104), the signal $LS_{ON}$ (pin 312) is high (e.g., a logic "1" or a logic high signal and/or a signal having a sufficient voltage magnitude to turn on transistor 320, for example), and the signal $LS_{ONZ}$ (pin 314) is low (e.g., a logic "0" or a logic low signal and/or a signal having a voltage magnitude low enough to keep transistor 338, for example, turned off). Controller 302 manages the coordination of these signals. A high $LS_{GATE}$ signal turns on transistor 322. A high $LS_{ON}$ signal at the gate of transistor 320 turns on transistor 320. A low $LS_{ONZ}$ signal (e.g., an inverted version of the $LS_{ON}$ signal) at the gates of transistor 332 and transistor 338 turns off these two transistors. Therefore, when low-side transistor 104 is on, pre-biasing circuitry 326 and 328 is turned off via the $LS_{ONZ}$ signal from pin 314. If low-side transistor 104 is on, transistor 320 couples OUT node 112 to node 340, which is coupled to first input 214 of low-side sense amplifier 210. The voltage at node 342 is provided by transistor 322, which has a gate at the same level as low-side transistor 104, due to the gate of transistor 322 being biased by the $LS_{GATE}$ pin 308. Therefore, the inputs to low-side sense amplifier 210 are provided by low-side transistor 104 and the sense transistor (e.g., transistor 322), when low-side transistor 104 is on.

If low-side transistor 104 is off, pre-biasing circuitry 326 and 328 are engaged to pre-bias low-side sense amplifier 210 to reduce the settling time of low-side sense amplifier 210 when low-side transistor 104 turns back on. More specifically, when low-side transistor 104 is turned off by the $LS_{GATE}$ signal going low, $LS_{ON}$ is low and $LS_{ONZ}$ is high. If $LS_{ON}$ is low, transistor 320 is off, which disconnects OUT node 112 from node 340 and first input 214. If $LS_{ONZ}$ is high, transistors 332 and 338 turn on. Current source 334 provides a current $I_{BIAS}$, which biases transistor 330. The value of $I_{BIAS}$ and the size of transistor 330 may be designed such that the value at OUT node 112 (when low-side transistor 104 is on) is approximately equal to the value at node 336 (when low-side transistor 104 is off). Because transistor 332 is on when $LS_{ONZ}$ is high, the voltage at node 336 is provided to node 340, which is coupled to first input 214 of low-side sense amplifier 210. If transistor 322 is off but transistor 338 is on, the voltage at node 342 is provided by transistor 338, which is coupled to the second input 216 of low-side sense amplifier 210. Therefore, when low-side transistor 104 is off, the input voltages to the low-side sense amplifier 210 are provided by transistors 330 and 338.

When low-side transistor 104 is off in this example, the input voltages to the low-side sense amplifier 210 do not fall to zero, as they may in the example in FIG. 2. Instead, the input voltages to low-side sense amplifier 210 may be kept close to the voltage value found at OUT node 112 when low-side transistor 104 is on. Therefore, when low-side transistor 104 turns on, the voltage values at inputs 214 and 216 are already close to the final settling voltage values found at OUT node 112 and the drain of transistor 322. Pre-biasing the low-side sense amplifier 210 with pre-biasing circuitry 326 and 328 reduces the settling time for the voltages at inputs 214 and 216 of low-side sense amplifier 210.

Other components in circuit 300 may work similarly to the description above. For example, current 354 is mirrored by current mirror 344 to produce current 356. Current 356 may then be provided to additional current mirrors so that the sensed current that represents the current through low-side transistor 104 may be provided to the IPROPI pin 318 of controller 302. Controller 302 may then control the operation of the driver based at least in part on this sensed current.

A similar solution may be implemented for high-side transistor 102. Pre-biasing circuitry pre-biases the high-side sense amplifier if the high-side transistor 102 is off, thereby reducing the settling time when high-side transistor 102 turns back on. An example of circuitry to pre-bias the high-side sense amplifier is discussed with respect to FIG. 4.

Figure 4:
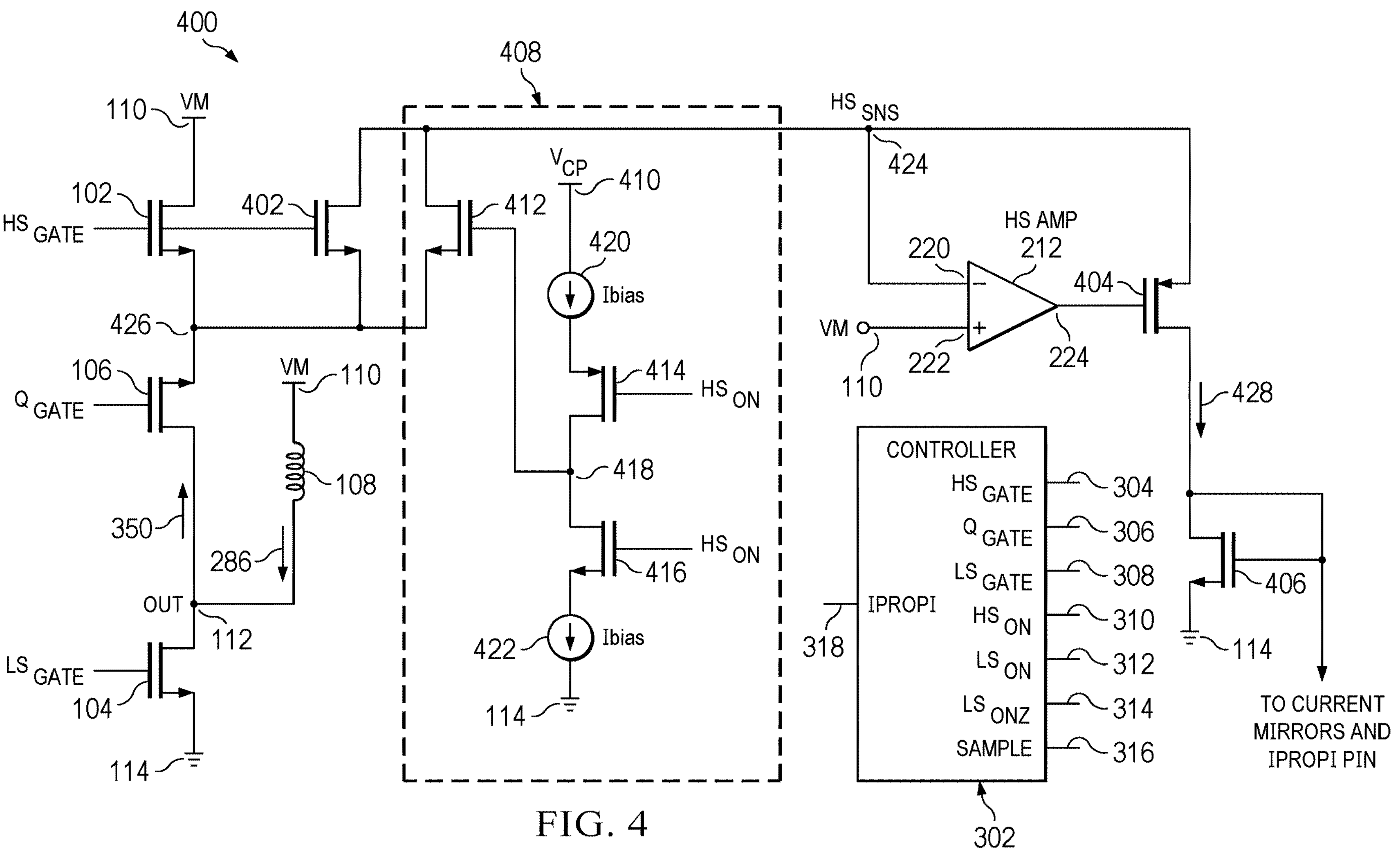
FIG. 4 is a circuit diagram for high-side current sensing in accordance with various examples herein.

FIG. 4 is a diagram of a circuit 400 for high-side current sensing in accordance with various examples herein. Circuit 400 includes passive circuitry to pre-bias the high-side sense amplifier if the high-side transistor is off. Pre-biasing the high-side sense amplifier reduces the delay between the high-side transistor turning on and the settling time of the high-side sense amplifier. Circuitry to pre-bias the low-side sense amplifier is not shown in FIG. 4 for simplicity, but is instead shown in FIG. 3 and described above.

In FIG. 4, various transistors in circuit 400 may be NMOS or PMOS transistors as shown in FIG. 4. Other transistors (or equivalent devices) may be used instead with little or no change to the remaining circuitry. Circuit 400 includes high-side transistor 102, low-side transistor 104, and quench transistor 106. In some examples, quench transistor 106 may be removed, and low-side transistor 104 is directly coupled to high-side transistor 102. The examples herein may also include drivers that do not have quench transistor 106. Circuit 300 also includes load 108 (and/or a node/terminal/pin that may be connected to a load 108), voltage source VM 110 (and/or a node/terminal/pin that may be connected to a voltage source VM 110), node 112, ground 114 (and/or a node/terminal/pin that may be connected to a common potential, such as ground 114), and high-side sense amplifier 212. High-side sense amplifier 212 has a first input 220, a second input 222, and an output 224.

Circuit 400 includes controller 302, which may operate similarly to controller 302 described above with respect to FIG. 3. In some example embodiments, circuit 400 is implemented in the same package and/or semiconductor die as controller 302 and/or circuit 300, but in other example embodiments they are implemented in separate packages and/or semiconductor die. Controller 302 may control the operation of the circuitry in circuit 400 (via various signals from pins 304, 306, 308, 310, 312, 314, 316, and 318) using a sensed current as feedback to regulate the load current 286. Controller 302 includes any hardware, software, firmware, digital logic, or circuitry for performing the operations described herein. Controller 302 may be a processor, microprocessor, microcontroller, power management integrated circuit, system-on-a-chip, or any other device suitable for performing the operations herein. Controller 302 may include other pins and connections not shown here.

Circuit 400 also includes transistors 402, 404, and 406. Circuit 400 includes pre-biasing circuitry 408. Pre-biasing circuitry 408 includes voltage source $V_{CP}$ 410, which may be a voltage provided by a charge pump in one example. Pre-biasing circuitry 408 includes transistors 412, 414, and 416, and node 418. Transistors 412, 414, and 416 may be referred to as pre-bias transistors in some examples. Pre-biasing circuitry 408 includes current sources 420 and 422, which each provide a current $I_{BIAS}$ to bias the transistors in pre-biasing circuitry 408. Circuit 400 also includes node 424, which may be referred to as a high-side sense ($HS_{SNS}$) node. Circuit 400 also includes node 426 and current 428.

In circuit 400, transistor 402 is a sense transistor with a gate coupled to the gate of high-side transistor 102 and a source coupled to the source of high-side transistor 102. Transistor 402 may be an NMOS transistor in one example. Transistor 402 is configured to sense the current flowing through high-side transistor 102 and ultimately provide that sensed current to controller 302, via various current mirrors and an IPROPI pin 318.

Pre-biasing circuitry 408 is configured to provide a bias voltage to first input 220 of high-side sense amplifier 212 if high-side transistor 102 is off, as described below. Pre-biasing circuitry includes a transistor 412, which has a drain coupled to the drain of transistor 402 and a source coupled to the source of transistor 402. The gate of transistor 412 is coupled to node 418. Transistor 414 has a source coupled to current source 420 and a drain coupled to node 418. Transistor 414 has a gate that receives an $HS_{ON}$ signal from controller 302 to turn on transistor 414. Transistor 416 has a source coupled to current source 422 and a drain coupled to node 418. Transistor 416 has a gate that receives an $HS_{ON}$ signal from controller 302 to turn on transistor 416.

In operation, high-side transistor 102 is off (e.g., non-conducting) during a charge phase, as discussed above with respect to FIG. 1. To turn high-side transistor 102 off, controller 302 provides a low signal at $HS_{GATE}$ (pin 304), which is coupled to the gate of high-side transistor 102. The $HS_{ON}$ signal (pin 310) is also low at this time. Also, $Q_{GATE}$ is high, and quench transistor 106 is on at this time. Since $HS_{GATE}$ (pin 304) is low, transistor 402 is also off since it is an NMOS device. Because transistor 402 is off, the voltage at node 424 ($HS_{SNS}$) is floating (at least for a period of time).

Within pre-biasing circuitry 408, when the $HS_{ON}$ signal is low, transistor 414 is on (e.g., conducting), and the gate of transistor 412 (e.g., node 418) is charged to the voltage magnitude of voltage source $V_{CP}$ 410. The voltage at voltage source $V_{CP}$ 410 may be greater than the voltage at voltage source VM 110, such as 5V greater than voltage source VM 110 in an example. Thereafter, the voltage at node 424 ($HS_{SNS}$), which was previously a floating voltage, is charged to the voltage at voltage source VM 110. Node 424 is charged to this voltage due to quench transistor 106 being on, which charges node 426 to the voltage at voltage source VM 110. Therefore, the gate of transistor 412 is at a higher voltage ($V_{CP}$) than the source of transistor 412 (VM). Transistor 412 turns on and the drain of transistor 412 (e.g., node 424) charges to the voltage value at voltage source VM 110 (or slightly less than the voltage magnitude of voltage source VM 110 due to the losses associated with the intervening components). Concurrently, transistor 416 is off. Therefore, when the high-side transistor 102 is off, the voltage at node 424 is charged to a voltage value at the voltage source VM 110, which is then provided to the first input 220 of high-side sense amplifier 212. The second input 222 of high-side sense amplifier 212 is coupled to voltage source VM 110. Therefore, the inputs 220 and 222 of high-side sense amplifier 212 are biased with voltages at or close to the voltage from voltage source VM 110 when high-side transistor 102 is off. In this manner, the high-side sense amplifier 212 is pre-biased, so the internal components of high-side sense amplifier 212 will settle to their final values more quickly than the example circuit in FIG. 2.

High-side transistor 102 and transistor 402 turn on when signal $HS_{GATE}$ goes high (e.g., the voltage magnitude of the $HS_{GATE}$ signal is greater than the threshold voltages of transistors 102 and 402) from controller 302. At this time, $HS_{ON}$ (pin 310) is also high. Quench transistor 106 is on and low-side transistor 104 is off, due to the signals provided to their respective gates from controller 302. If the $HS_{ON}$ signal is high, transistor 416 turns on, and the gate of transistor 412 is pulled low towards ground 114, via transistor 416 and current source 422. Pulling the gate of transistor 412 low turns off transistor 412. If transistor 412 is off, the voltage at node 424 is charged to the voltage at voltage source VM 110 via transistor 402. Therefore, when high-side transistor 102 is on, the voltage at node 424 is the voltage from voltage source VM 110. When high-side transistor 102 is off, pre-biasing circuitry 408 also charges the voltage at node 424 to the voltage from voltage source VM 110 (or slightly less than the voltage magnitude of voltage source VM 110 due to the losses associated with the intervening components). The circuitry in circuit 400 keeps the voltage at node 424 close to the voltage from voltage source VM 110 at all times, and the voltage at second input 222 is coupled to voltage source VM 110. Because the voltage at node 424 is always close to the voltage source VM 110, the voltages within high-side sense amplifier 212 have to settle very little when high-side transistor 102 transitions from off to on, which causes a fast settling time for high-side sense amplifier 212.

High-side sense amplifier 212 and transistor 404 provide a current 428 to transistor 406 and additional circuitry. The current 428 is representative of the current through high-side transistor 102 when high-side transistor 102 is on, and this current is ultimately provided to an IPROPI pin via additional circuitry, such as the current mirrors shown in FIG. 2. Controller 302 can then control the operation of the driver responsive to the sensed current provided by transistor 402.

In the examples described above, pre-biasing circuitry is provided to both a low-side sense amplifier 210 and a high-side sense amplifier 212. The pre-biasing circuitry reduces the settling time of the sense amplifiers 210 and 212 during operation. The reduced settling time provides for faster operation for the driver or other circuitry that uses this scheme.

Figure 5:
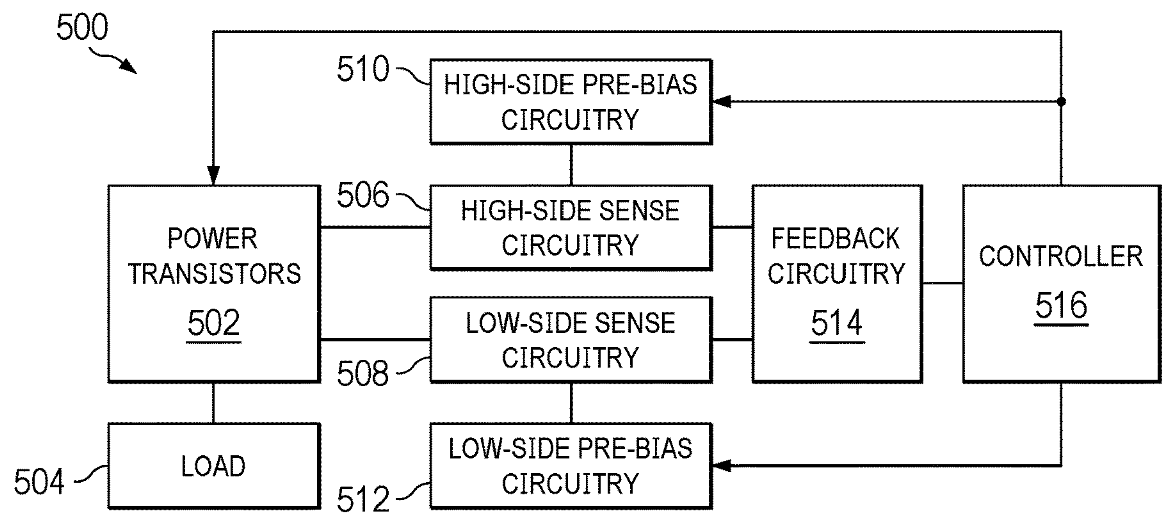
FIG. 5 is a block diagram of a current-sensing system with pre-biasing circuitry in accordance with various examples herein.

FIG. 5 is a block diagram of a current-sensing system 500 with pre-biasing circuitry in accordance with various examples herein. The components of system 500 may include any internal circuitry configured to perform the operations described herein. In this example, system 500 includes power transistors that operate a driver, but other applications may be present in other examples.

System 500 includes power transistors 502, load 504, high-side sense circuitry 506, and low-side sense circuitry 508. High-side pre-bias circuitry 510 is coupled to high-side sense circuitry 506, and low-side pre-bias circuitry 512 is coupled to low-side sense circuitry 508. High-side sense circuitry 506 and low-side sense circuitry 508 are coupled to feedback circuitry 514, which is coupled to controller 516. Controller 516 provides control signals to power transistors 502, high-side pre-bias circuitry 510, and low-side pre-bias circuitry 512 in an example.

As described above, power transistors 502 (such as high-side transistor 102, low-side transistor 104, and/or quench transistor 106) may provide current to a load 504. Power transistors 502 may provide power for a driver, a battery, a motor, a personal electronic device, an automobile, industrial equipment, and/or any other system. High-side sense circuitry 506 may sense the current through a high-side transistor, such as high-side transistor 102. The high-side sense circuitry 506 may include components such as a sense transistor (e.g., transistor 402) and a high-side sense amplifier (e.g., high-side sense amplifier 212). Low-side sense circuitry 508 may sense the current through a low-side transistor, such as low-side transistor 104. The low-side sense circuitry 508 may include components such as a sense transistor (e.g., transistor 320) and a low-side sense amplifier (e.g., low-side sense amplifier 210). However, other circuitry may be useful in other embodiments to sense current. The circuitry described herein is merely one example of sense circuitry.

High-side pre-bias circuitry 510 may include circuitry configured to bias a high-side sense amplifier, such as high-side sense amplifier 212. High-side pre-bias circuitry 510 may be the circuitry described with respect to FIG. 4, such as pre-biasing circuitry 408. In other examples, different pre-bias circuitry may be useful. Any circuitry useful for providing a bias voltage for high-side sense amplifier 212 while high-side transistor 102 is off may be useful.

Low-side pre-bias circuitry 512 may include circuitry configured to bias a low-side sense amplifier, such as low-side sense amplifier 210. Low-side pre-bias circuitry 512 may be the circuitry described with respect to FIG. 3, such as pre-biasing circuitry 326 and 328. In other examples, different pre-bias circuitry may be useful. Any circuitry useful for providing a bias voltage for low-side sense amplifier 210 while low-side transistor 104 is off may be useful.

Feedback circuitry 514 may be any circuitry that couples signals from high-side sense circuitry 506 and low-side sense circuitry 508 to a controller 516. One example of feedback circuitry includes current mirrors 234, 236, 238, and 240 described above. Feedback circuitry 514 receives a sense current that corresponds to a current in one of the power transistors and provides that sense current to controller 516. Any suitable circuitry may be useful for providing the sense current, or another indicator of the current through a power transistor, to controller 516.

Controller 516 may be a controller such as controller 302 described above with respect to FIGS. 3 and 4. Controller 516 may receive a sense current and then control the operation of other components in system 500. Controller 516 may use the sense current or other feedback to control power transistors 502, high-side pre-bias circuitry 510, and/or low-side pre-bias circuitry 512. Controller 516 may perform these operations by providing signals that turn on or off various circuit components, such as transistors. In other examples, controller 516 may control these circuit components in other ways, such as with digital logic components, switches, etc.

Figure 6:
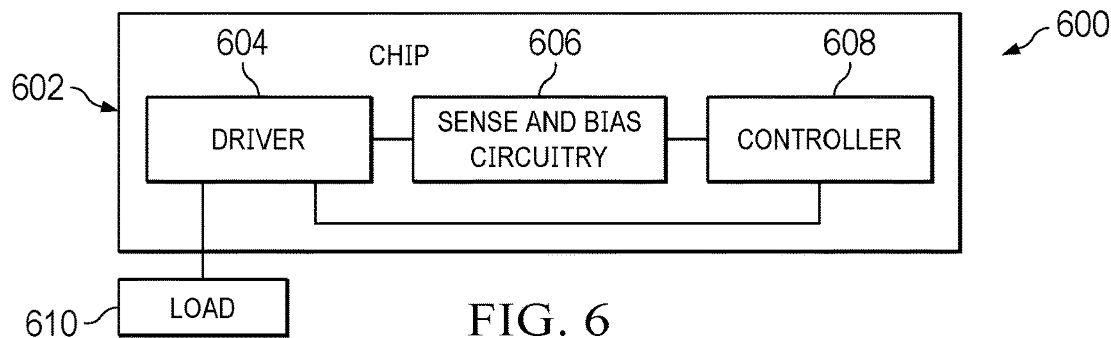
FIG. 6 is a block diagram of a system for pre-biased current sensing in accordance with various examples herein.

FIG. 6 is a block diagram of a system 600 for pre-biased current sensing in accordance with various examples herein. System 600 includes a chip 602. Chip 602 includes a driver 604, sense and bias circuitry 606, and a controller 608. System 600 may also include a load 610. Driver 604 provides current to load 610. Driver 604 may include components such as high-side transistor 102 and low-side transistor 104. Sense and bias circuitry 606 senses current information from driver 604, and may also pre-bias sense amplifiers 210 and 212 as described above with respect to FIGS. 3 and 4. Sense and bias circuitry 606 may provide information regarding the operation of system 600 to controller 608. Controller 608 may control operations of driver 604 and sense and bias circuitry 606 to properly drive load 610.

Figure 7:
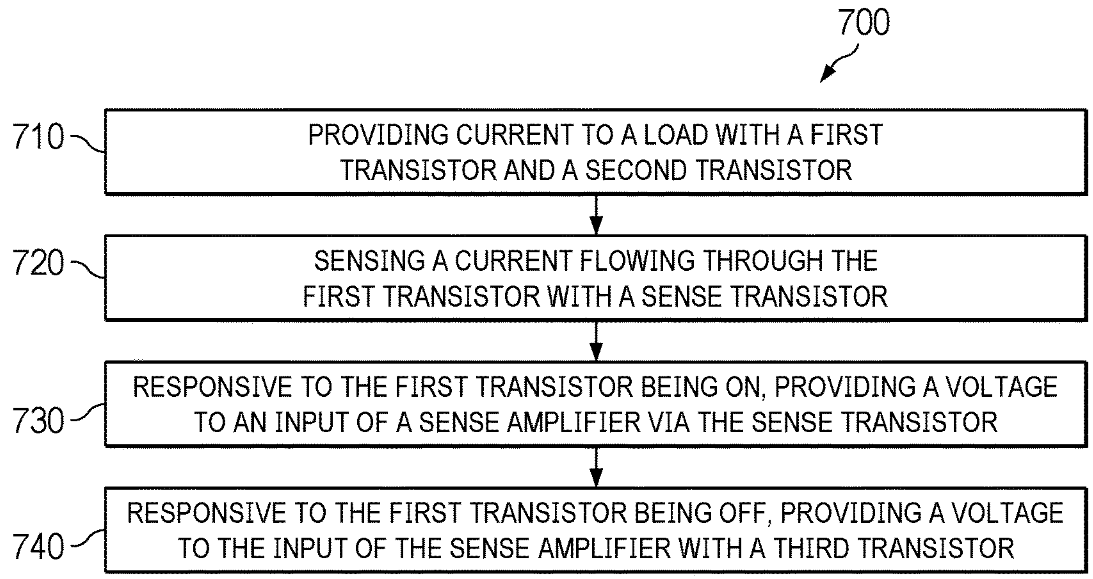
FIG. 7 is a flow diagram of a method for pre-biased current sensing in accordance with various examples.

FIG. 7 is a flow diagram of a method 700 for pre-biased current sensing in accordance with various examples herein. The steps of method 700 may be performed in any suitable order. The hardware components described above with respect to FIGS. 3-6 may perform method 700 in some examples. Any suitable hardware or digital logic may perform method 700 in some examples.

Method 700 begins at 710, where a first transistor and a second transistor provide current to a load. As shown in FIGS. 3 and 4, a high-side transistor 102 and a low-side transistor 104 may provide current to a load 108. In some examples, a quench transistor 106 may also be useful.

Method 700 continues at 720, where a sense transistor senses a current flowing through the first transistor. For example, transistor 322 senses the current flowing through low-side transistor 104 in one example. As another example, transistor 402 senses the current flowing through high-side transistor 102.

Method 700 continues at 730, where responsive to the first transistor being on, the sense transistor provides a voltage to an input of a sense amplifier. In one example, transistor 322 provides a voltage to second input 216 of low-side sense amplifier 210. In another example, transistor 402 provides a voltage to first input 220 of high-side sense amplifier 212.

Method 700 continues at 740, where responsive to the first transistor being off, a third transistor provides a voltage to the input of the sense amplifier. The third transistor may be a component of pre-biasing circuitry in an example. For example, if low-side transistor 104 is off, transistor 338 provides a voltage to second input 216 of low-side sense amplifier 210. In another example, if high-side transistor 102 is off, transistor 412 provides a voltage to first input 220 of high-side sense amplifier 212.

In the examples described herein, a sense amplifier may be pre-biased and placed in an active condition even if a power transistor associated with the sense amplifier is off. Because the sense amplifier is pre-charged or pre-biased prior to the power transistor turning back on, the settling time of the sense amplifier is much lower than in other solutions. In the examples described herein, a driver or other circuitry may achieve a higher frequency of operation while still receiving current sense information from the sense amplifiers.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component. While the use of particular transistors are described herein, other transistors (or equivalent devices) may be used instead with little or no change to the remaining circuitry. For example, a MOSFET (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). While, in some examples, certain elements may be included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A circuit comprising:

a first transistor having first and second terminals, the first terminal coupled to a first voltage supply terminal;

a second transistor having first and second terminals, the first terminal of the second transistor coupled to the second terminal of the first transistor, the second terminal of the second transistor coupled to a ground terminal;

a third transistor having first and second terminals, the first terminal of the third transistor coupled to the first terminal of the second transistor;

an amplifier having first and second inputs and an output, the first input coupled to the second terminal of the third transistor;

a fourth transistor having a first terminal coupled to the second input of the amplifier and having a second terminal coupled to the ground terminal; and bias circuitry having a first terminal coupled to the first input of the amplifier and having a second terminal coupled to a second voltage supply terminal.

2. The circuit of claim 1, wherein the bias circuitry includes:

a fifth transistor having a first terminal coupled to the first input of the amplifier, and having a second terminal.

3. The circuit of claim 2, wherein the bias circuitry further includes:

a current source having a terminal coupled to the second terminal of the fifth transistor; and a sixth transistor having a terminal coupled to the terminal of the current source and to the second terminal of the fifth transistor and having a control terminal coupled to the second voltage supply terminal.

4. The circuit of claim 2, wherein the bias circuitry further includes a sixth transistor having a first terminal coupled to the second input of the amplifier and to the first terminal of the fourth transistor, and having a second terminal coupled to the ground terminal.

5. The circuit of claim 1, further comprising a fifth transistor having a control terminal coupled to the output of the amplifier, having a first terminal coupled to the first terminal of the fourth transistor and to the second input of the amplifier, and having a second terminal.

6. The circuit of claim 5, further comprising a current mirror coupled to the second terminal of the fifth transistor.

7. The circuit of claim 1, further comprising a fifth transistor coupling the second terminals of the first transistor to the first terminal of the second transistors.

8. The circuit of claim 1, wherein the amplifier is a first amplifier and the bias circuitry is first bias circuitry, the circuit further comprising:

a fifth transistor having first and second terminals, the first terminal coupled to the second terminal of the first transistor;

a second amplifier having an input coupled to the second terminal of the fifth transistor, and having an output; and second bias circuitry coupled to the first and fifth transistors and to the input of the second amplifier.

9. The circuit of claim 8, wherein the second bias circuitry includes:

a sixth transistor having a first terminal coupled to the input of the second amplifier, having a second terminal coupled to the second terminal of the first transistor, and having a control terminal;

a first current source having a terminal;

a seventh transistor having a first terminal coupled to the terminal of the first current source, and having a second terminal coupled to the control terminal of the sixth transistor;

an eighth transistor having a first terminal coupled to the second terminal of the seventh transistor and to the control terminal of the sixth transistor, and having a second terminal; and a second current source having a terminal coupled to the second terminal of the eighth transistor.

10. A circuit comprising:

a first transistor having a first terminal coupled to a voltage supply terminal, and having a second terminal;

a second transistor having a first terminal coupled to the second terminal of the first transistor, and having a second terminal coupled to a ground terminal;

a third transistor having first and second terminals, the first terminal of the third transistor coupled to the second terminal of the first transistor;

an amplifier having a first input coupled to the second terminal of the third transistor, having a second input coupled to the voltage supply terminal, and having an output; and bias circuitry having a first terminal coupled to the second terminal of the first transistor and to the first terminal of the third transistor and having a second terminal coupled to the second terminal of the third transistors and to the first input of the amplifier.

11. The circuit of claim 10, further comprising:

a fourth transistor coupling the second terminals of the first transistor to the first terminal of the second transistors.

12. The circuit of claim 10, wherein the bias circuitry includes a fourth transistor having a first terminal coupled to the first input of the amplifier, having a second terminal coupled to the second terminal of the first transistor, and having a control terminal.

13. The circuit of claim 12, wherein the bias circuitry further includes:

a first current source having a terminal;

a fifth transistor having a first terminal coupled to the terminal of the first current source, and having a second terminal coupled to the control terminal of the fourth transistor;

a sixth transistor having a first terminal coupled to the second terminal of the fifth transistor and to the control terminal of the fourth transistor, and having a second terminal; and a second current source having a terminal coupled to the second terminal of the sixth transistor.

14. The circuit of claim 10, further comprising:

a fourth transistor having a control terminal coupled to the output of the amplifier, having a first terminal coupled to the first input of amplifier, and having a second terminal; and a fifth transistor having a terminal, and having control terminal coupled to the terminal of the fifth transistor and to the second terminal of the fourth transistor.

15. The circuit of claim 10, wherein the bias circuitry is a first bias circuitry and the amplifier is a first amplifier, and the circuit further comprising:

a fourth transistor having first and second terminals, the first terminal coupled to the first terminal of the second transistor;

a second amplifier having first and second inputs and an output, the first input of the second amplifier coupled to the second terminal of the fourth transistor;

a fifth transistor having a terminal coupled to the second input of the second amplifier; and second bias circuitry having an output coupled to the first input of the second amplifier.

16. The circuit of claim 15, wherein the second bias circuitry includes:

a sixth transistor having a first terminal coupled to the first input of the second amplifier, and having a second terminal;

a current source having a terminal coupled to the second terminal of the sixth transistor; and a seventh transistor having a terminal coupled to the terminal of the current source and to the second terminal of the sixth transistor.

17. The circuit of claim 16, wherein the second bias circuitry further includes an eighth transistor having a terminal coupled to the second input of the second amplifier and to the terminal of the fifth transistor.

18. A circuit comprising:

a first transistor having a first terminal coupled to a first voltage supply terminal, and having a second terminal;

a second transistor having a first terminal coupled to the second terminal of the first transistor, and having a second terminal coupled to a ground terminal;

a third transistor having first and second terminals, the first terminal of the third transistor coupled to the second terminal of the first transistor;

a first amplifier having a first input coupled to the second terminal of the third transistor, having a second input coupled to the first voltage supply terminal, and having an output;

first bias circuitry having a first terminal coupled to the second terminal of the first transistor and to the first terminal of the third transistor and having a second terminal coupled to the second terminal of the third transistors and to the first input of the first amplifier;

a fourth transistor having first and second terminals, the first terminal of the fourth transistor coupled to the first terminal of the second transistor;

a second amplifier having first and second inputs and an output, the first input of the second amplifier coupled to the second terminal of the fourth transistor;

a fifth transistor having a first terminal coupled to the second input of the second amplifier and having a second terminal coupled to the ground terminal; and second bias circuitry having a first terminal coupled to the first input of the second amplifier and having a second terminal coupled to a second voltage supply terminal.

19. The circuit of claim 18, wherein the first bias circuitry includes:

a sixth transistor having a first terminal coupled to the first input of the first amplifier, having a second terminal coupled to the second terminal of the first transistor, and having a control terminal;

a first current source having a terminal;

a seventh transistor having a first terminal coupled to the terminal of the first current source, and having a second terminal coupled to the control terminal of the sixth transistor;

an eighth transistor having a first terminal coupled to the second terminal of the seventh transistor and to the control terminal of the sixth transistor, and having a second terminal; and a second current source having a terminal coupled to the second terminal of the eighth transistor.

20. The circuit of claim 18, wherein the second bias circuitry includes:

a sixth transistor having a first terminal coupled to the first input of the second amplifier, and having a second terminal;

a current source having a terminal coupled to the second terminal of the sixth transistor; and a seventh transistor having a terminal coupled to the terminal of the current source and to the second terminal of the sixth transistor, and having a control terminal coupled to the second voltage supply terminal.

21. The circuit of claim 20, wherein the second bias circuitry further includes an eighth transistor having a first terminal coupled to the second input of the second amplifier and to the first terminal of the fifth transistor, and having a second terminal coupled to the ground terminal.

22. The circuit of claim 18, further comprising:

a sixth transistor having a control terminal coupled to the output of the first amplifier, having a first terminal coupled to the first input of first amplifier, and having a second terminal; and a seventh transistor having a terminal, and having control terminal coupled to the terminal of the seventh transistor and to the second terminal of the sixth transistor.

23. The circuit of claim 18, further comprising a sixth transistor coupling the second terminals of the first transistor to the first terminal of the second transistors.

24. The circuit of claim 18, further comprising:

a sixth transistor having a control terminal coupled to the output of the second amplifier, having a first terminal coupled to the first terminal of the fifth transistor and to the second input of the second amplifier, and having a second terminal; and a current mirror coupled to the second terminal of the sixth transistor.

25. A circuit comprising:

a first transistor having first and second terminals, the first terminal coupled to a first voltage supply terminal;

a second transistor having first and second terminals, the first terminal of the second transistor coupled to the second terminal of the first transistor, the second terminal of the second transistor coupled to a ground terminal;

a third transistor having first and second terminals, the first terminal of the third transistor coupled to the first terminal of the second transistor;

an amplifier having first and second inputs and an output, the first input coupled to the second terminal of the third transistor;

a fourth transistor having a first terminal coupled to the second input of the amplifier and having a second terminal coupled to the ground terminal;

a fifth transistor having a first terminal coupled to the first input of the amplifier, and having a second terminal;

a current source having a terminal coupled to the second terminal of the fifth transistor;

a sixth transistor having a terminal coupled to the terminal of the current source and to the second terminal of the fifth transistor and having a control terminal coupled to a second voltage supply terminal; and a seventh transistor having a first terminal coupled to the second input of the amplifier and to the first terminal of the fourth transistor, and having a second terminal coupled to the ground terminal.

26. A circuit comprising:

a first transistor having a first terminal coupled to a voltage supply terminal, and having a second terminal;

a second transistor having a first terminal coupled to the second terminal of the first transistor, and having a second terminal coupled to a ground terminal;

a third transistor having first and second terminals, the first terminal of the third transistor coupled to the second terminal of the first transistor;

an amplifier having a first input coupled to the second terminal of the third transistor, having a second input coupled to the voltage supply terminal, and having an output;

a fourth transistor having a first terminal coupled to the first input of the amplifier, having a second terminal coupled to the second terminal of the first transistor, and having a control terminal;

a first current source having a terminal;

a fifth transistor having a first terminal coupled to the terminal of the first current source, and having a second terminal coupled to the control terminal of the fourth transistor;

a sixth transistor having a first terminal coupled to the second terminal of the fifth transistor and to the control terminal of the fourth transistor, and having a second terminal; and a second current source having a terminal coupled to the second terminal of the sixth transistor.

* * * * *